United States Patent
Nakashima et al.

(10) Patent No.: US 8,953,654 B2
(45) Date of Patent: Feb. 10, 2015

(54) SEMICONDUCTOR LASER DRIVING CIRCUIT AND SEMICONDUCTOR LASER DEVICE INCLUDING THE SAME

(71) Applicant: Sony Corporation, Tokyo (JP)

(72) Inventors: Katsuya Nakashima, Nagasaki (JP); Yoshifumi Miyajima, Kanagawa (JP)

(73) Assignee: Sony Corporation, Tokyo (JP)

( * ) Notice: Subject to any disclaimer, the term of this patent is extended or adjusted under 35 U.S.C. 154(b) by 48 days.

(21) Appl. No.: 13/646,088

(22) Filed: Oct. 5, 2012

(65) Prior Publication Data

US 2013/0094530 A1     Apr. 18, 2013

(30) Foreign Application Priority Data

Oct. 12, 2011  (JP) .................. 2011-224857

(51) Int. Cl.
*H01S 3/00*      (2006.01)
*H01S 5/042*     (2006.01)
*H01S 5/062*     (2006.01)

(52) U.S. Cl.
CPC ........... *H01S 5/0427* (2013.01); *H01S 5/06213* (2013.01); *H01S 5/06226* (2013.01)
USPC .................... 372/38.02; 372/38.1; 372/38.07

(58) Field of Classification Search
CPC   H01S 5/0427; H01S 5/06213; H01S 5/06226
USPC .................................. 372/38.1, 38.02, 38.07
See application file for complete search history.

(56) References Cited

U.S. PATENT DOCUMENTS

| 6,055,251 A * | 4/2000 | Ouchi et al. ..................... 372/28 |
| 2007/0171946 A1* | 7/2007 | Hase et al. ................. 372/29.02 |

FOREIGN PATENT DOCUMENTS

| JP | 11-340561 | 12/1999 | |
| JP | 2004343441 A * | 12/2004 | ................ G01S 7/48 |

* cited by examiner

*Primary Examiner* — Yuanda Zhang
(74) *Attorney, Agent, or Firm* — Sony Corporation

(57) ABSTRACT

A semiconductor laser driving circuit supplies a drive current to a semiconductor laser diode connected to an output terminal based on an input signal inputted thereto through an input terminal, thereby controlling the semiconductor laser diode. The semiconductor laser driving circuit includes a first supply portion supplying a bias current, and a first supply signal having a frequency component whose frequency is equal to or lower than a first frequency of the input signal, and a second supply portion supplying a second supply signal having a frequency component whose frequency is higher than a second frequency of the input signal.

7 Claims, 10 Drawing Sheets

SEMICONDUCTOR LASER DRIVING CIRCUIT AND SEMICONDUCTOR LASER DEVICE INCLUDING THE SAME

BACKGROUND

The present disclosure relates to a semiconductor laser driving circuit and a semiconductor laser device including the same.

In recent years, the speed-up of the optical communication has been rapidly progressed. Thus, a giga b/s-optical communication system is previously put to practical use. In addition, a semiconductor laser diode such as a Vertical Cavity Surface Emitting Laser (VCSE) is used as a light source for a short-wavelength optical transceiver of the high-speed optical communication system.

An operation of the semiconductor laser diode is controlled by a semiconductor laser driving circuit. The semiconductor laser driving circuit controls the operation of the semiconductor laser diode in accordance with a magnitude of a drive current supplied to the semiconductor laser diode, thereby expressing binary digital data. Normally, the semiconductor laser driving circuit supplies a large drive current I1 to the semiconductor laser diode when data "1" is expressed, while the semiconductor laser driving circuit supplies a small drive current I0 to the semiconductor laser diode when data "0" is expressed.

When the semiconductor laser driving circuit supplies the large drive current I1 to the semiconductor laser diode, a voltage V1 is produced across opposite terminals of the semiconductor laser diode. Although the voltage V1 is changed depending on the environment such as a temperature, the voltage V1 rises up to about 2.4 V in some cases. Therefore, a configuration with which a voltage of about 2.4 V can be applied to a semiconductor laser diode is required for the semiconductor laser driving circuit. As a result, this impedes either the lowering of the voltage or the speed-up of the semiconductor laser driving circuit.

Then, a laser diode driving circuit described in Japanese Patent Laid-Open No. Hei 11-340561 sorts drive currents I1 and I0 into a bias current, and a modulation current generated in a switching portion, and supplies both of the bias current and the modulation current to the semiconductor laser diode. As a result, a transistor in a switching portion which generates the modulation current is prevented from being saturated, and thus the laser diode driving circuit can carry out the high-speed operation even at the low voltage.

SUMMARY

However, in the laser diode driving circuit described in Japanese Patent Laid-Open No. Hei 11-340561, the drive currents I1 and I0 are sorted into the bias current and the modulation current which are in turn supplied to the semiconductor laser diode. As a result, external parts such as a bias tee and a capacitive element are required for the semiconductor laser diode, which impedes on-chip promotion of the semiconductor laser diode driving circuit.

In addition, recently, there is known a semiconductor laser device in which plural semiconductor laser diodes are disposed in an array. The semiconductor laser diodes, for example, are disposed at pitches as narrow as 250 µm in the semiconductor laser device. Semiconductor laser diode driving circuits for driving the semiconductor laser diodes, respectively, are provided in the semiconductor laser device. Since the external parts such as the bias tee and the capacitive element become necessary every semiconductor laser diode driving circuit, there is caused a problem that the semiconductor laser device is scaled up. In addition, the external parts are high in cost. Thus, when the number of external parts is large, a manufacturing cost of the semiconductor laser device becomes high.

The present disclosure has been made in order to solve the problems described above, and it is therefore desirable to provide a semiconductor laser driving circuit which is capable of being operated at a high speed and at a low voltage even when any of external parts such as a bias tee is not used, and a semiconductor laser device including the same.

In order to attain the desire described above, according to an embodiment of the present disclosure, there is provided a semiconductor laser driving circuit supplying a drive current to a semiconductor laser diode connected to an output terminal based on an input signal inputted thereto through an input terminal, thereby controlling the semiconductor laser diode, the semiconductor laser driving circuit, including:

a first supply portion supplying a bias current, and a first supply signal having a frequency component whose frequency is equal to or lower than a first frequency of the input signal; and a second supply portion supplying a second supply signal having a frequency component whose frequency is higher than a second frequency of the input signal.

According to another embodiment of the present disclosure, there is provided a semiconductor laser device, including:

a semiconductor laser diode; and a semiconductor laser driving circuit supplying a drive current to the semiconductor laser diode connected to an output terminal based on an input signal inputted thereto through an input terminal, thereby controlling the semiconductor laser diode, in which the semiconductor laser driving circuit includes:

a first supply portion supplying a bias current, and a first supply signal having a frequency component whose frequency is equal to or lower than a first frequency of the input signal; and a second supply portion supplying a second supply signal having a frequency component whose frequency is higher than a second frequency of the input signal.

As set forth hereinabove, the high-speed operation can be carried out at the low voltage even when any of external parts such as a bias tee is not used.

DETAILED DESCRIPTION OF THE PREFERRED EMBODIMENTS

Embodiments of the present disclosure will be described in detail hereinafter with reference to the accompanying drawings.

First Embodiment

Figure 1:
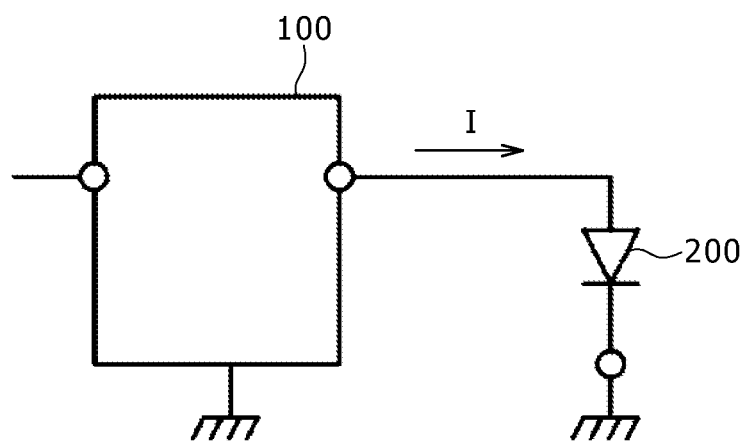
FIG. 1 is a circuit diagram, partly in block, showing a configuration of a semiconductor laser device according to a first embodiment of the present disclosure.

FIG. 1 is a circuit diagram, partly in block, showing a configuration of a semiconductor laser device 1 according to a first embodiment of the present disclosure. The semiconductor laser device 1 includes a semiconductor laser diode 200, and a semiconductor laser driving circuit 100 for driving the semiconductor laser diode 200. An anode electrode of the semiconductor laser diode 200 is connected to the semiconductor laser driving circuit 100, and a cathode thereof is grounded.

The semiconductor laser driving circuit 100 supplies a drive current I to the semiconductor laser diode 200, thereby driving the semiconductor laser diode 200. The drive current I which is supplied to the semiconductor laser diode 200 by the semiconductor laser driving circuit 100 will now be described with reference to FIG. 2.

Figure 2:
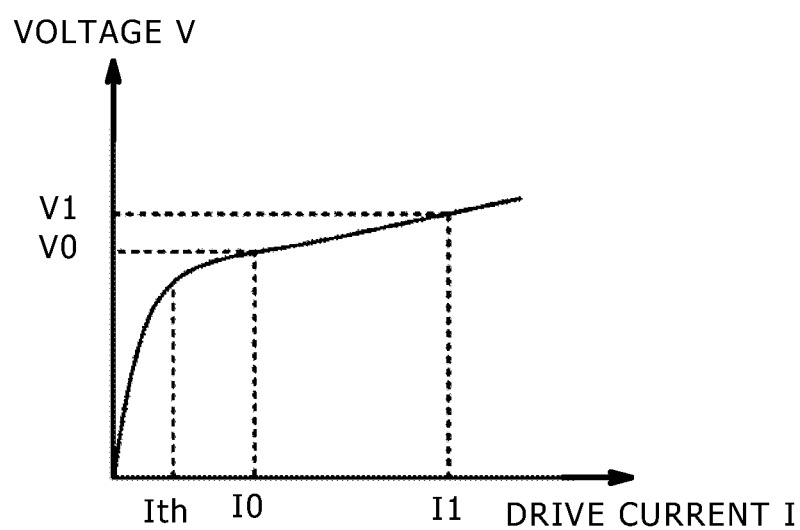
FIG. 2 is a graphical representation explaining I-V characteristics of the semiconductor laser diode according to the first embodiment of the present disclosure.

FIG. 2 is a graphical representation explaining I-V characteristics of the semiconductor laser diode 200. In a region in which a current caused to flow through the semiconductor laser diode 200 is equal to or larger than an oscillation threshold value Ith, the I-V characteristics show approximately a straight line in which a gradient is approximately constant, and thus obey Ohm's law. The semiconductor laser driving circuit 100 supplies one of a first drive current I0 and a second drive current I1 to the semiconductor laser diode 200. That is to say, the semiconductor laser driving circuit 100 supplies the large drive current I1 when data "1" is expressed, while the semiconductor laser driving circuit 100 supplies the small drive current I0 when data "0" is expressed.

As shown in FIG. 2, when the small drive current I0 is supplied to the semiconductor laser diode 200, a voltage V0 is produced across opposite terminals of the semiconductor laser diode 200. On the other hand, when the large drive current I1 is supplied to the semiconductor laser diode 200, a voltage V1 is produced across the opposite terminals of the semiconductor laser diode 200. As described above, the voltage V1 rises up to about 2.4 V in some cases. When the semiconductor laser driving circuit 100 is composed of a low-withstand voltage transistor in order to drive the semiconductor laser diode 200 at a high speed, there is the possibility that the transistor may not withstand the voltage V1 (about 2.4 V) to be broken down. On the other hand, when the semiconductor laser driving circuit 100 is composed of a high-withstand voltage transistor in order to prevent the semiconductor laser diode 200 from being broken down, the semiconductor laser device may not be driven at the high speed.

Then, in the semiconductor laser driving circuit 100 in the first embodiment of the present disclosure, the drive current I is sorted into a bias current IB and a modulation current. Also, the modulation current is sorted into a low-frequency current IL having a frequency component whose frequency is equal to or lower than a first frequency f1, and a high-frequency current IH having a frequency component whose frequency is higher than the first frequency f1. The semiconductor laser driving circuit 100 supplies both of a first drive current Ia obtained by superimposing the low-frequency current IL on the bias current IB, and the high-frequency IH to the semiconductor laser diode 200. Here, as will be described below, the semiconductor laser driving circuit 100 is a second embodiment of the present disclosure.

Second Embodiment

Figure 3:
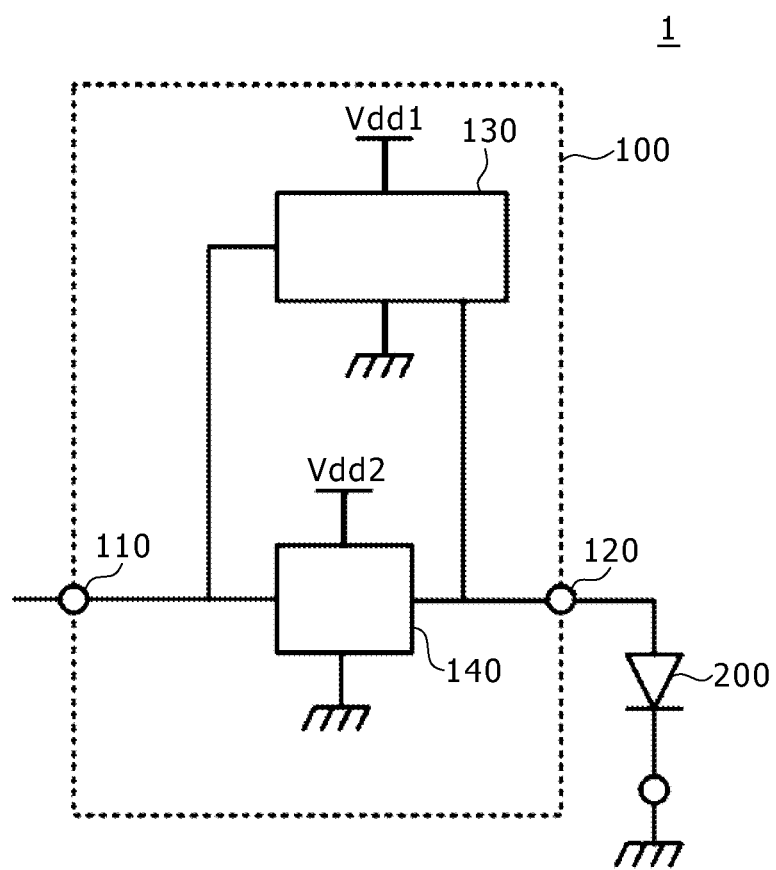
FIG. 3 is a circuit diagram, partly in block, showing a configuration of a semiconductor laser driving circuit according to a second embodiment of the present disclosure.

The semiconductor laser driving circuit 100 according to the second embodiment of the present disclosure included in the semiconductor laser device 1 according to of the first embodiment of the present disclosure will now be described with reference to FIG. 3. The semiconductor laser device 1 includes the semiconductor laser driving circuit 100 and the semiconductor laser diode 200.

The semiconductor laser driving circuit 100 includes an input terminal 110 and an output terminal 120. In this case, an input signal representing data "0, 1" is inputted to the input terminal 110. Also, the output terminal 120 is connected to the semiconductor laser diode 200, and the drive current I is outputted through the output terminal 120. In addition, the semiconductor laser driving circuit 100 includes a first supply portion 130 and a second supply portion 140. In this case, the first supply portion 130 supplies both of the bias current and the low-frequency current IL to the semiconductor laser diode 200. Also, the second supply portion 140 supplies the high-frequency current IH to the semiconductor laser diode 200.

The first supply portion 130 is connected to a first power source electric potential Vdd1. The second supply portion 140 is connected to a second power source electric potential Vdd2. The first power source electric potential Vdd1 is higher than the second power source electric potential Vdd2 (Vdd1>Vdd2).

The details of the configuration of the semiconductor laser driving circuit 100 will now be described with reference to FIG. 4. The first supply portion 130 of the semiconductor laser driving circuit 100 includes a current mirror circuit 111, a first capacitive element C1, a current source 112, and a preceding stage circuit 113. In this case, the current mirror circuit 111 has a transistor M11 and a transistor M12. One terminal of the first capacitive element C1 is connected to the first power source electric potential Vdd1, and the other terminal thereof is connected to the current mirror circuit 111. The current source 112 generates the bias current IB. Also, the preceding stage circuit 113 receives an input signal.

As described above, the current mirror circuit includes the transistor M11 and the transistor M12. In this case, a source terminal of the transistor M11 is connected to the first power source electric potential Vdd1, and a drain terminal thereof is connected to the current source 112. Also, a source terminal of the transistor M12 is connected to the first power source electric potential Vdd1, and a drain terminal thereof is connected to the output terminal 120. Each of gate terminals of the transistors M11 and M12 is connected to the drain terminal of the transistor M11.

Each of the transistors M11 and M12 which the current mirror circuit 111 includes a PMOS (Positive Metal Oxide Semiconductor) type transistor, and is a high-withstand voltage transistor which can withstand even a high voltage V1 applied across the opposite terminals of the semiconductor laser diode 200. Each of the transistors M11 and M12 is lower in drive speed than a low-withstand voltage transistor.

One terminal of the first capacitive element C1 is connected to the first power source electric potential Vdd1, and the other terminal thereof is connected to each of the gate terminals of the transistors M11 and M12. Although a capacitance value of the first capacitive element C1, as will be described later, is determined depending on the first frequency f1, the capacitance value of the first capacitive element C1 is equal to or smaller than several tens of pF. The first capacitive element C1 can be realized in the form of a semiconductor element within an IC chip instead of being realized in the form of an external part.

One terminal of the current source 112 is connected to the drain terminal of the transistor M11, and the other terminal thereof is grounded. The current source 112 generates the bias current IB. The bias current IB is supplied to the semiconductor laser diode 200 through the current mirror circuit 111.

One terminal of the preceding stage circuit 113 is connected to the input terminal 110, and the other terminal thereof is connected to the drain terminal of the transistor M11. The preceding stage circuit 113 outputs the input signal inputted thereto through the input terminal 110 to the current mirror circuit 111.

Although details will be described later, in the semiconductor laser driving circuit 100 of the second embodiment, the current mirror circuit 111 and the first capacitive element C1 compose a low-pass filter LPF. The LPF composed of the current mirror circuit 111 and the first capacitive element C1 generates the low-frequency current IL having the signal component whose frequency is equal to or lower than the first frequency f1 from the input signal. The first supply portion 130 superimposes the low-frequency current IL generated from the LPF, and the bias current IB generated from the current source 112 on each other, and supplies the resulting current to the semiconductor laser diode 200. Here, the low-frequency current IL means a first supply signal having a frequency component whose frequency is equal to or lower than the first frequency f1 of the input signal.

A second supply portion 140 includes a drive circuit 121 and a second capacitive element C2. One terminal of the drive circuit 121 is connected to the input terminal 110. Thus, the drive circuit 121 receives the input signal and outputs the input signal thus received to the second capacitive element C2. The drive circuit 121 is connected to the second power source electric potential Vdd2. Thus, the drive circuit 121 is operated by receiving supply of a power source voltage lower than the first power source electric potential Vdd1.

One terminal of the second capacitive element C2 is connected to the drive circuit 121, and the other terminal thereof is connected to the output terminal 120. The second capacitive element C2 has a capacitance value equal to or smaller than several tens of pF. The capacitance value of the second capacitive element C2 is determined depending on the first frequency f1. The second capacitive element C2 can be realized in the form of a semiconductor element within an IC chip instead of being realized in the form of an external part.

The input signal passes through the second capacitive element C2 via the drive circuit 121 to be converted into a high-frequency current IH having a frequency component whose frequency is equal to or higher than a second frequency f2. The resulting high-frequency current IH is supplied to the semiconductor laser diode 200 through the output terminal 120.

The input signal which has been inputted to the second supply portion 140 is supplied to the semicdonductor laser diode 200 through both of the drive circuit 121 and the second capacitive element C2. Since the second capacitive element C2 is provided within the IC chip, the capacitance value of the second capacitive element C2, as described above, is limited to a value which is less than or comparable to about several tens of pF. When the second capacitive element C2 is composed of an external part, a capacitance value of the second capacitive element C2 can be made equal to or larger than several tens of nF.

When the capacitance value of the second capacitive element C2 is sufficiently large as in the case where the second capacitive element C2 is composed of the external part, the low-frequency component (the low-frequency current IL) of the input signal can pass through the second supply portion 140. However, when the capacitance value of the second capacitive element C2 is made small in order to provide the second capacitive element C2 within the IC chip as with the second embodiment, the low-frequency component (the low-frequency current IL) of the input signal is cut off in the second supply portion 140 and as a result, a high-frequency component (a high-frequency current IH) is supplied to the semiconductor laser diode 200 through a second supply portion 140. Here, the high-frequency current IH means the second supply signal having the frequency component whose frequency is higher than the second frequency f2 of the input signal.

When the current is simply sorted into the bias current IB and the drive current I which are in turn supplied to the semiconductor laser diode 200, for the purpose of supplying the low-frequency component (the low-frequency current IL) contained in the drive current I to the semiconductor laser diode 200 without cutting off the low-frequency component (the low-frequency current IL), there is expected a method in which the second capacitive element C2 used in the second supply portion 140 is realized as the external part. In this case, since it is necessary to provide the external part or component in the semiconductor laser driving circuit 100, the miniaturization and one-chip promotion of the semiconductor laser driving circuit 100 become difficult to realize.

Then, in the second embodiment, the low-frequency component of the input signal which has been attenuated in the second supply portion 140 is supplied together with the bias current IB from the first supply portion 130 to the semiconductor laser diode 200. Thus, even when the capacitive element having such a capacitance value as to be adapted to be built in the IC chip is used, the input signal containing therein both of the low-frequency component and the high-frequency component can be supplied to the semiconductor laser diode 200. In addition, the LPF is realized by adding the first capacitive element C1 to the current mirror circuit 111 of the first supply portion 130. As a result, the number of external parts can be reduced without increasing the circuit scale as compared with the case where an LPF is newly provided in the first supply portion 130.

Next, a description will be given with respect to the LPF composed of both of the current mirror circuit 111 and the first capacitive element C1 shown in FIG. 4. When let gm11 and gm12, and C11 and C12 be conductances and gate capacitances of the transistors M11 and M12 which the current mirror circuit 111 includes, respectively, a cut-off frequency of the LPF is determined depending on the conductance gm11 and the gate capacitance C11 of the transistor M11, and the gate capacitance C12 of the transistor M12, and the capacitance value C1 of the first capacitive element C1. Specifically, when let C3 be a composite capacitance obtained by adding the gate capacitances C11 and C12 of the transistors M11 and M12, and the capacitance value C1 of the first capacitive element C1, a cut-off frequency, that is, the first frequency f1 is expressed by $f1=gm11/(2\pi \times C3)$. The LPF composed of the current mirror circuit 111 and the first capacitive element C1 passes therethrough the signal (the low-frequency current IL) having the frequency component whose frequency is equal to or lower than $f1=gmC11/(2\pi \times C3)$, and cuts off any of other signals other than the signal (the low-frequency current IL).

Figure 5:
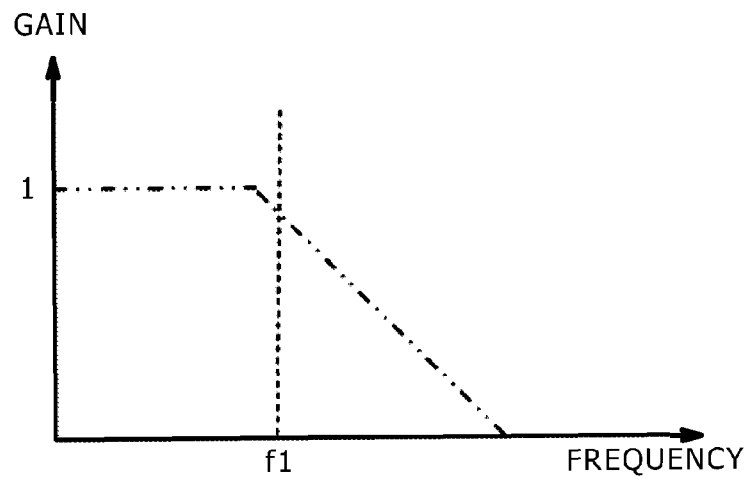
FIG. 5 is a graphical representation explaining input/output characteristics of a low-pass filter composed of a current mirror circuit and a first capacitive element in the semiconductor laser driving circuit according to the second embodiment of the present disclosure.

FIG. 5 is a graphical representation explaining input/output characteristics of the LPF composed of the current mirror circuit 111 and the first capacitive element C1. As shown in FIG. 5, in the LPF composed of the current mirror circuit 111 and the first capacitive element C1, when the sizes of the transistors M11 and M12 are approximately equal to each other, a gain corresponding to a frequency equal to or lower than the first frequency f1 is about "1," and thus the LPF outputs the signal inputted thereto almost as it is. On the other hand, the gain corresponding to the frequency higher than the first frequency f1 is gradually reduced, and thus the signal having the frequency component whose frequency is higher than the first frequency f1 is hard to pass through the LPF.

The gate capacitances C11 and C12, and the conductances gm11 and gm12 of the transistors M11 and M12 are determined depending on the sizes of the transistors M11 and M12, respectively. Although the size of the transistor is easy to suffer the restrictions of the design, the first frequency f1 as the cut-off frequency of the LPF can be readily adjusted by adjusting the capacitance value C1 of the first capacitive element C1.

Figure 6:
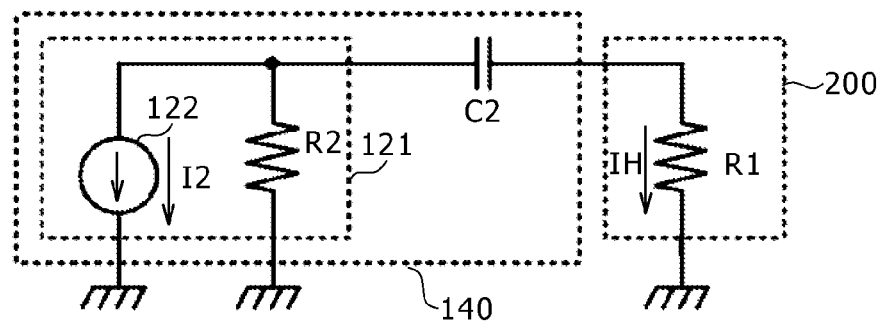
FIG. 6 is a circuit diagram showing an equivalent circuit in a small signal analysis for a second supply portion and the semiconductor laser diode.

Next, a description will be given with respect to the principles that the second supply portion 140 passes therethrough the signal (the high-frequency current IH) having the frequency component whose frequency is higher than the second frequency f2, and cuts off the signal (the low-frequency current IL) having the frequency component other than the frequency higher than the second frequency f2 with reference to FIG. 6. FIG. 6 is a circuit diagram showing an equivalent circuit in a small current analysis made for the circuit including both of the second supply portion 140 and the semiconductor laser diode 200.

In FIG. 6, a small resistance component of the semiconductor laser diode 200 is designated by reference symbol R1. The high-frequency current IH is caused to flow through the semiconductor laser diode 200. The drive circuit 121 is equivalently expressed by a resistance component R2 and a current source 122. A current I3 caused to flow from the current source 122 is equal to the input signal.

Here, as can be seen from FIG. 6, a transfer function from the current I2 caused to flow through the current source 112 to the current IH caused to flow through the small resistance component R1 can be expressed by $(sC2 \times R2)/\{1+sC2(R1+R2)\}$. This transfer function is a first-order high-pass filter (HPF) type transfer function. A cut-off frequency (the second frequency f2) of the HPF type transfer function is expressed by $1/\{2\pi C2(R1+R2)\}$. The transfer function when the frequency is sufficientoy high is expressed by $R2/\{(R1+R2)\}$. The input signal inputted to the second supply portion 140 passes therethrough the first-order high-pass filter, whereby the signal having the frequency component whose frequency is lower than the cut-off frequency (second frequency) f2 is cut off, and the signal (the high-frequency current IH) having the frequency component whose frequency is equal to or higher than the second frequency is supplied to the semiconductor laser diode 200.

Figure 7:
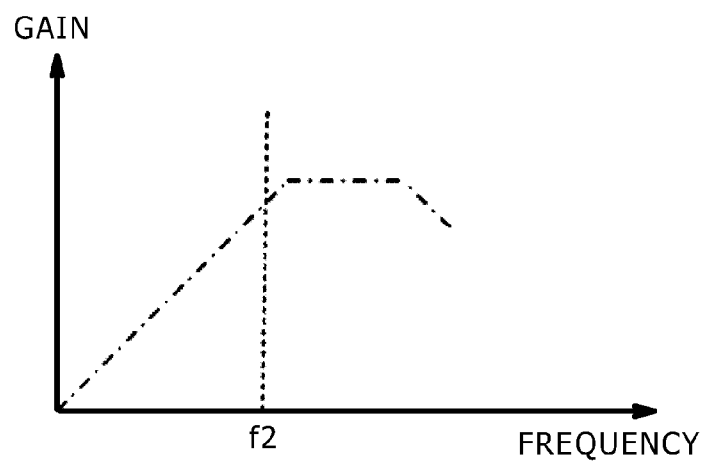
FIG. 7 is a graphical representation explaining input/output characteristics of a high-pass filter of the second supply portion in the semiconductor laser driving circuit according to the second embodiment of the present disclosure.

FIG. 7 is a graphical representation explaining input/output characteristics of the first-order high-pass filter HPF. As shown in FIG. 7, in the first-order high-pass filter HPF, the gain corresponding to the frequency lower than the second frequency f2 is gradually reduced, and thus the signal having the frequency component whose frequency is lower than the second frequency f2 is hard to pass through the HPF. In the first-order high-pass filter HPF, a gain corresponding to a frequency equal to or higher than the second frequency f2 is about "1," and thus the HPF outputs the signal inputted thereto almost as it is. In the first-order high-pass filter HPF, the frequency exceeds the second frequency f2 to be further increased, the gain becomes smaller than "1" again. This results from the band limitation of the semiconductor laser driving circuit 100 itself. Thus, the frequency with which the gain becomes smaller than "1" is determined depending on the circuit configuration of the semiconductor laser driving circuit 100.

Figure 8:
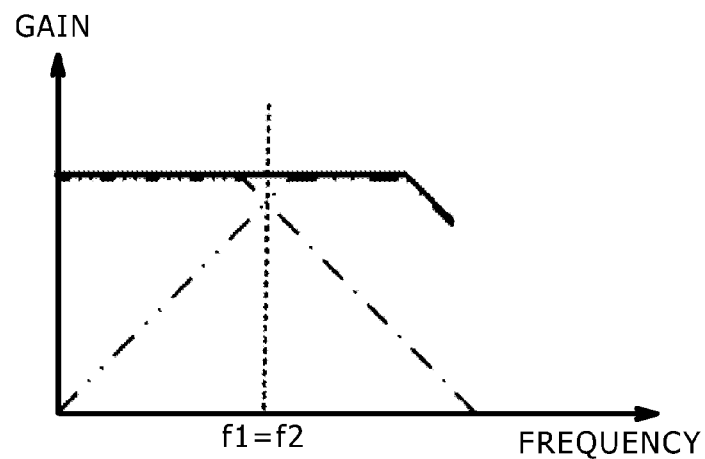
FIG. 8 is a graphical representation explaining input/output characteristics of the semiconductor driving circuit according to the second embodiment of the present disclosure.

As described above, the input signal which has been inputted to the semiconductor laser driving circuit 100 is sorted into the low-frequency current IL and the high-frequency current IH which are in turn supplied from the first supply portion 130 and the second supply portion 140 to the semiconductor laser diode 200. As shown in FIG. 8, the input/output characteristics of the semiconductor laser driving circuit 100 are such that the input/output characteristics of the LPF of the first supply portion 130, and the input/output characteristics of the HPF of the second supply portion 140 are superimposed on each other.

FIG. 8 shows the input/output characteristics of the semiconductor laser driving circuit 100. In FIG. 8, the input/output characteristics of the first supply portion 130 are indicated by a dashed line, the input/output characteristics of the second supply portion 140 are indicated by a dashed-two dotted line, and the input/output characteristics of the semiconductor laser driving circuit 100 are indicated by a solid line. Also, FIG. 8 shows the case where the first frequency f1 as the cut-off frequency of the LPF of the first supply portion 130, and the second frequency f2 as the cut-off frequency of the HPF of the second supply portion 140 are equal to each other (f1=f2).

When as shown in FIG. 8, the first frequency f1 as the cut-off frequency of the LPF of the first supply portion 130, and the second frequency f2 as the cut-off frequency of the HPF of the second supply portion 140 are equal to each other (f1=f2), the input/output characteristics of the semiconductor laser driving circuit 100 become approximately flat. Therefore, the input signal which has been inputted to the semiconductor laser driving circuit 100 is supplied to the semiconductor laser diode 200 almost as it is.

Figure 9:
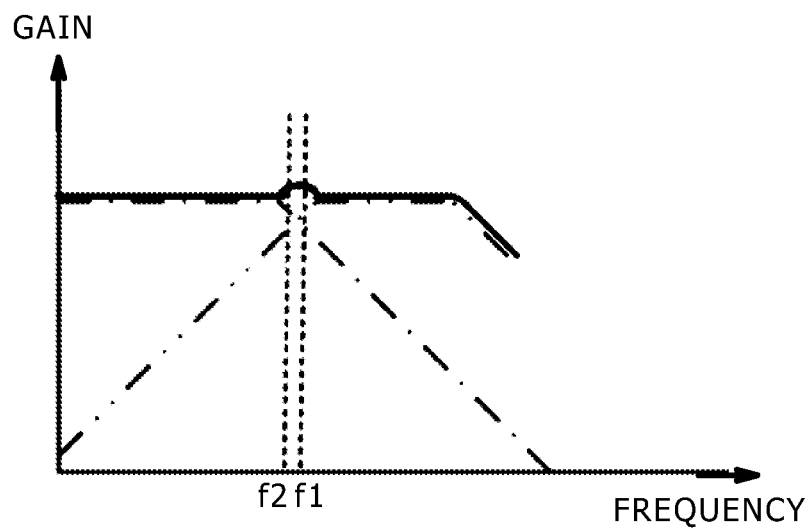
FIG. 9 is a graphical representation explaining input/output characteristics of the semiconductor driving circuit according to the second embodiment of the present disclosure.

A description will be given with respect to the case where the first frequency f1 as the cut-off frequency of the LPF of the first supply portion 130, and the second frequency f2 as the cut-off frequency of the HPF of the second supply portion 140 are different from each other with reference to FIGS. 9 and 10. FIG. 9 is a graphical representation explaining the case where the first frequency f1 as the cut-off frequency of the LPF of the first supply portion 130 is higher than the second frequency f2 as the cut-off frequency of the HPF of the second supply portion 140. When as shown in FIG. 9, the first frequency f1 as the cut-off frequency of the LPF of the first supply portion 130 is higher than the second frequency f2 as the cut-off frequency of the HPF of the second supply portion 140, the first supply portion 130 and the second supply portion 140 both supply the input signals whose frequencies are close to the cut-off frequencies f1 and f2, respectively, to the semiconductor laser diode 200. For this reason, as far as the input/output characteristics of the semiconductor laser driving circuit 100, the gain becomes larger than "1" in the vicinities of the cut-off frequencies f1 and f2.

Figure 10:
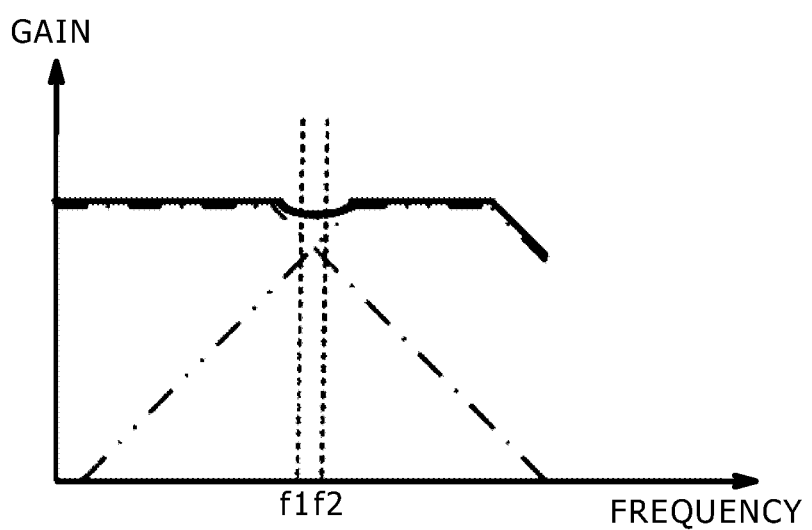
FIG. 10 is a graphical representation explaining input/output characteristics of the semiconductor driving circuit according to the second embodiment of the present disclosure.

FIG. 10 is a graphical representation explaining the case where the first frequency f1 as the cut-off frequency of the LPF of the first supply portion 130 is lower than the second frequency f2 as the cut-off frequency of the HPF of the second supply portion 140. When as shown in FIG. 10, the first frequency f1 as the cut-off frequency of the LPF of the first supply portion 130 is lower than the second frequency f2 as the cut-off frequency of the HPF of the second supply portion 140, the frequency supply portion 130 and the second supply portion 140 becomes both hard to supply the input signals whose frequencies are in the vicinities of the cut-off frequencies f1 and f2, respectively, to the semiconductor laser diode 200. For this reason, as far as the input/output characteristics of the semiconductor laser driving circuit 100, the gain becomes smaller than "1" in the vicinities of the cut-off frequencies f1 and f2.

When the first frequency f1 as the cut-off frequency of the LPF of the first supply portion 130 is different from the second frequency f2 as the cut-off frequency of the HPF of the second supply portion 140 in such a way, the input/output characteristics of the semiconductor laser driving circuit 100 are not flat. As a result, the input signals are distorted in the vicinities of the cut-off frequencies f1 and f2, respectively, and in this state, are both supplied to the semiconductor laser diode 200. Then, in the second embodiment, the capacitance value of the first capacitive element C1 of the first supply portion 130 is adjusted in such a way that the first frequency f1 as the cut-off frequency of the LPF of the first supply portion 130, and the second frequency f2 as the cut-off frequency of the HPF of the second supply portion 140 become approximately equal to each other. As a result, even when the input signal which is to be inputted to the semiconductor laser driving circuit 100 is sorted into the low-frequency current IL and the high-frequency current IH which are in turn supplied from the first supply portion 130 and the second supply portion 140 to the semiconductor laser diode 200, the signal having the signal waveform which is approximately the same as that of the input signal inputted to the semiconductor laser driving circuit 100 can be supplied to the semiconductor laser diode 200.

A description will now be given with respect to a concrete configuration of the preceding stage circuit 113 of the first supply portion 130, and a concrete configuration of the driving circuit 121 of the second supply portion 140 in the second embodiment with reference to FIG. 11. A differential input signal shall be inputted to the semiconductor laser driving circuit 100 shown in FIG. 11.

The preceding stage circuit 113 includes transistors M15 and M16, a first resistive element R31, a second current source 114, and a transistor M21.

A drain terminal of the transistor M15 is connected to the current source 112, a source terminal thereof is connected to the second current source 114, and a gate terminal thereof is connected to one of the input terminals 110. The transistor M15 amplifies the input signal, and delivers the input signal thus amplified to the current mirror circuit 111 composed of the transistor M11 and the transistor M12.

A drain terminal of the transistor M16 is connected to the first resistive element 31, a source terminal thereof is connected to the second current source 114, and a gate terminal thereof is connected to the other of the input terminals 110. One terminal of the second current source 114 is connected to each of the source terminals of the transistors M15 and M16, and the other terminal thereof is grounded. One terminal of the first resistive element R31 is connected to the second power source electric potential Vdd2, and the other terminal thereof is connected to the drain terminal of the transistor M16.

A drain terminal of the transistor M21 is connected to the current mirror circuit 111, and a source terminal thereof is connected to each of the drain terminal of the transistor M15, and the current source 112. The transistor M21 is a transistor which is low in drive speed although it exhibits the high-withstand voltage.

Each of the transistors M15 and M16 is a transistor which is high in drive speed although it exhibits the low-withstand voltage. A drain terminal of the transistor M16 is connected to the lower second power source electric potential Vdd2 which is lower than the first power source electric potential Vdd1 through the first resistive element R31. On the other hand, a drain terminal of the transistor M15 is connected to the current mirror circuit 111 through the transistor M21.

Here, let us consider the case where the transistor M15 is directly connected to the current mirror circuit 111. The current mirror circuit 111 is composed of the transistors M11 and M12 each exhibiting the high-withstand voltage, and is connected to the first power source electric potential Vdd1. Therefore, in the case where the transistor M15 is directly connected to the current mirror circuit 111, the voltage which drops from the power source electric potential Vdd1 by a voltage for the current mirror circuit 111 is applied to the drain terminal of the transistor M15. When a voltage equal to or larger than the withstand voltage is applied to the drain terminal of the transistor M15, the transistor M15 comes not to be normally operated.

In order to cope with such a situation, in the semiconductor laser driving circuit 100 according to the second embodiment of the present disclosure, the transistor M21 exhibiting the high-withstand voltage is provided between the transistor M15 and the current mirror circuit 111. A suitable bias voltage is applied to the gate terminal of the transistor M21, whereby the voltage applied to the transistor M15 can be made to drop from the first power source electric potential Vdd1 to the range of the withstand voltage of the transistor M15. The high-withstand voltage transistor M21 is provided in the output stage of the preceding stage circuit 113 in such a way, whereby the amplification stage of the preceding stage circuit 113 can be composed of the transistors M15 and M16 each exhibiting the low-withstand voltage, and thus the preceding stage circuit 113 can be driven at the low-withstand voltage and at the high speed.

Figure 11:
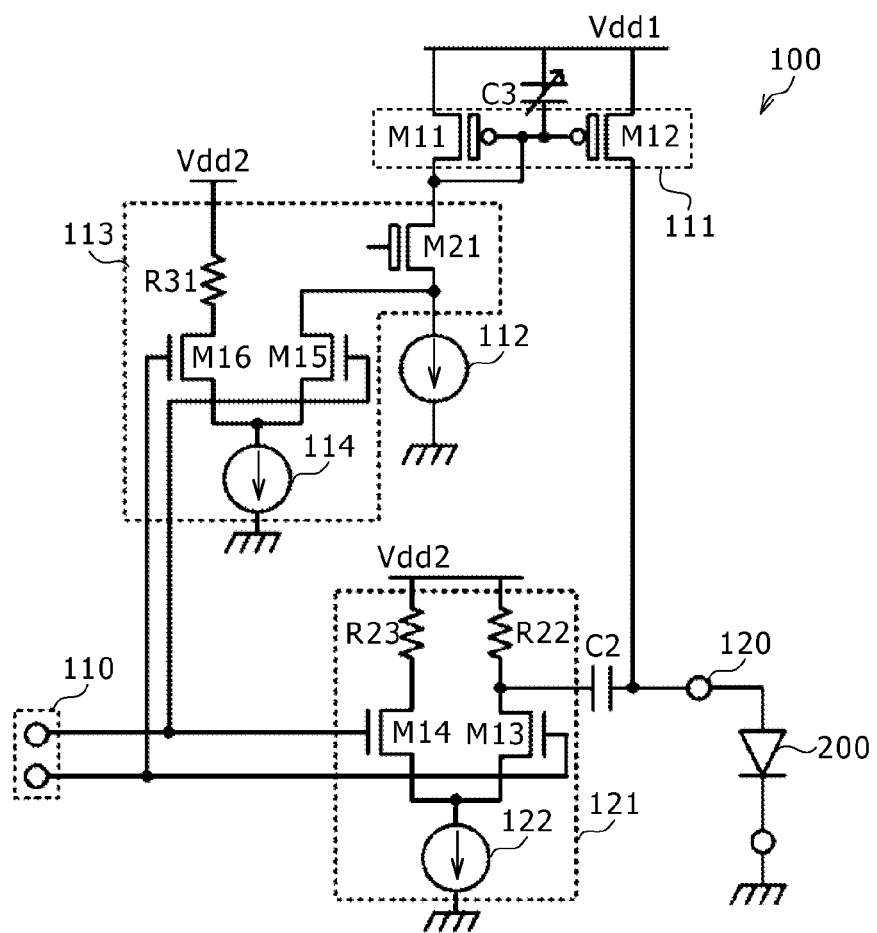
FIG. 11 is a circuit diagram showing a concrete configuration of the semiconductor laser driving circuit according to the second embodiment of the present disclosure.

The preceding stage circuit 113 shown in FIG. 11 converts the differential input signal into a single-phase input signal which is in turn supplied to the current mirror circuit 111.

Next, the drive circuit 121 will be described with reference to FIG. 11. The drive circuit 121 includes transistors M13 and M14, a second resistive element R22 and a third resistive element R23, and a third current source 122.

A drain terminal of the transistor M13 is connected to each of the second capacitive element C2 and the second resistive element R22, a source terminal thereof is connected to the third current source 122, and a gate terminal thereof is connected to the other of the input terminals 110.

A drain terminal of the transistor M14 is connected to the third resistive element R23, a source terminal thereof is connected to the third current source 122, and a gate terminal thereof is connected to one of the input terminals 110.

The transistor M13 amplifies the input signal which is in turn supplied to the second capacitive element C2. The transistors M13 and M14 of the drive circuit 121 shown in FIG. 11 convert the differential input signal into the single-phase signal in such a way.

One terminal of the second resistive element R22 is connected to the second power source electric potential Vdd2, and the other terminal thereof is connected to the drain terminal of the transistor M13. One terminal of the third resistive element R23 is connected to the second power source electric potential Vdd2, and the other terminal thereof is connected to the drain terminal of the transistor M14.

One terminal of the third current source 122 is connected to each of the source terminal of the transistors M13 and M14, and the other terminal thereof is grounded. The third current source 122 supplies the current to both of the transistors M13 and M14.

The drain terminal of the transistors M13 and M14 of the drive circuit 121 are connected to the second power source electric potential Vdd2 through the second and third resistive elements R22 and R23, respectively, and each of the transistors M13 and M14 is driven at the high speed although it exhibits the low-withstand voltage.

The drive circuit 121 shown in FIG. 11 is a so-called Current Mode Logic (CML) type circuit. The CML type drive circuit 121 has the advantage that the CML type drive circuit 121 is driven at the high speed, a waveform of an output signal therefrom is hard to distort, and thus a waveform quality is high. On the other hand, the CML type drive circuit 121 involves a problem that since the bias current is usually supplied from the third current source 122, the power consumption of the CML type drive circuit 121 becomes large. In addition, in the case of the CML type drive circuit 121, when the output amplitude of the circuit is large, each of the drain voltages of the transistors M13 and M14 is reduced, and thus each of the transistors M13 and M14 becomes a non-saturated state. In this case, each of the transistors M13 and M14 becomes difficult to normally operate. For example, when the second power source electric potential Vdd2 is 1.2 V, the CML type drive circuit 121 becomes difficult to output the signal having the amplitude of 400 mV or more.

Figure 12:
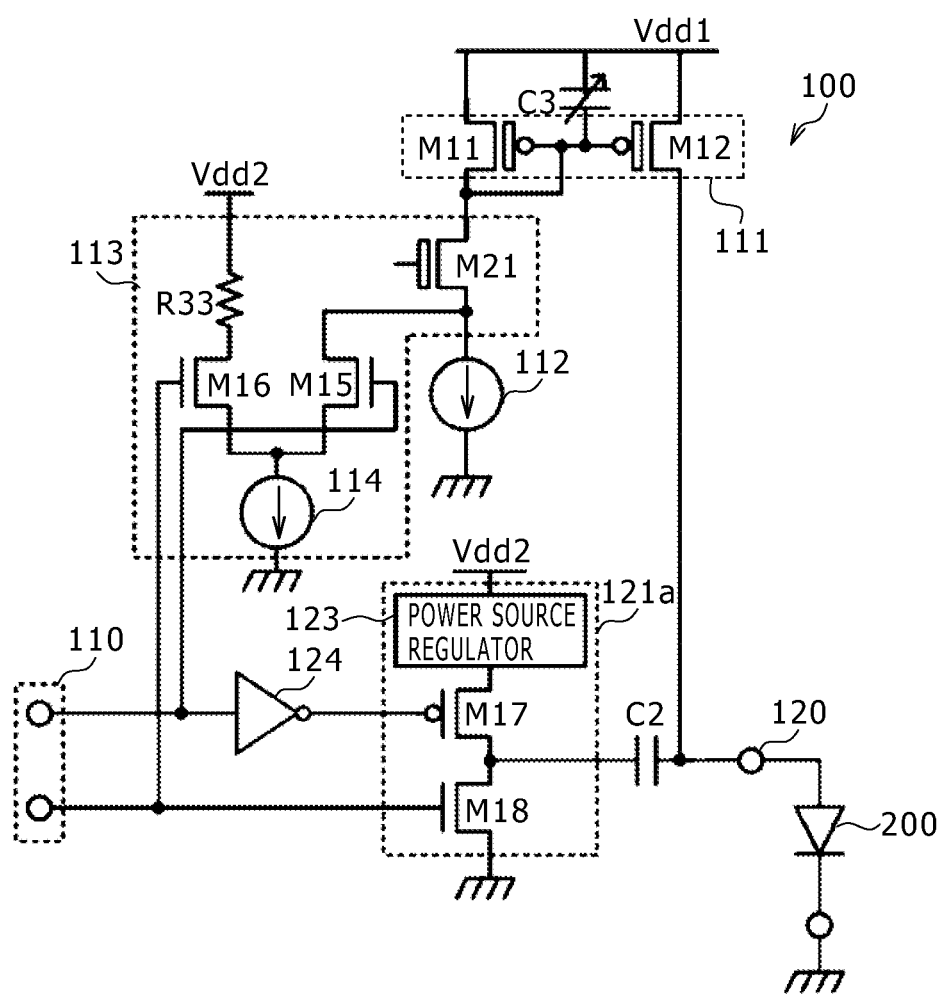
FIG. 12 is a circuit diagram showing a configuration of a semiconductor laser driving circuit according to a modification example of the second embodiment of the present disclosure.

FIG. 12 shows a drive circuit 121a of the semiconductor laser drive circuit 100 according to a modification example of the second embodiment of the present disclosure. The drive circuit 121a shown in FIG. 12 includes a power source regulator 123, and transistors M17 and M18.

The transistor M17 is a P-channel transistor. A source terminal of the transistor M17 is connected to the power source regulator 123, a drain terminal thereof is connected to the second capacitive element C2, and a gate terminal thereof is connected to one of the input terminals 110 through an inversion buffer 124.

On the other hand, the transistor M18 is an N-channel transistor. A drain terminal of the transistor M18 is connected to the second capacitive element C2, a gate terminal thereof is connected to the other of the input terminals 110, and a source terminal thereof is grounded.

Although each of the transistors M17 and M18 exhibits the low-withstand voltage, each of the transistors M17 and M18 is a transistor which can be operated at the high speed.

One terminal of the power source regulator 123 is connected to the second power source electric potential Vdd2, and the other terminal thereof is connected to the source terminal of the transistor M17.

The drive circuit 121a is a Push-Pull type drive circuit in which transistors of different conductivity types are connected in series with each other. Although a resistive element may be connected in series with the transistors M17 and M18, in the case shown in FIG. 12, the transistors M17 and M18 are longitudinally connected in series with each other, whereby an output impedance is adjusted, thereby carrying out the impedance matching.

The power source regulator 123 determines the output amplitude of the drive circuit 121a. When let R1 be a differential resistance of the semiconductor laser diode 200, let Rdr be an output impedance of the drive circuit 121a, and let −IH/2 be a current outputted from the drive circuit 121a in a phase of Push, and let IH/2 be a current outputted from the drive circuit 121a in a phase of Pull, an output voltage from the power source regulator 123 is expressed by (R1+Rdr)×IH. As can be seen from the output voltage as well from the power source regulator 123, unlike the CML type drive circuit 121, the Push-Pull type drive circuit 121a needs not to usually supply the bias current and thus can be operated with a less power consumption. In particular, the current caused to flow through the output stage of the Push-Pull type drive circuit 121a is ideally approximately equal to the current caused to flow through the semiconductor laser diode 200. In such a way, the Push-Pull type drive circuit 121a becomes one of the drive circuits each exhibiting the least power consumption. On the other hand, the Push-Pull type drive circuit 121a also has a disadvantage that since the balance between rising and trailing of the output signal is difficult to obtain, and so forth, the fine adjustment is necessary for enhancing the quality of the output waveform, and thus the circuit design becomes complicated. In addition, the Push-Pull type drive circuit 121a also involves a problem that the noise is easy to generate between the power source electric potential and the ground.

As described above, there are some choices in the configuration of the preceding stage circuit 113 and the drive circuit 121, and thus the suitable circuit configuration is chosen in accordance with the design cost and the power consumption which are required for the semiconductor laser drive circuit 100.

As has been described, in the semiconductor laser drive circuit 100 according to the second embodiment of the present disclosure, the input signal is sorted into the low-frequency current IL having the frequency component whose frequency is equal to or lower than the first frequency f1, and the high-frequency current IH having the frequency component whose frequency is higher than the first frequency f1. Also, the low-frequency current IL is superimposed on the bias current and the resulting current is supplied to the semiconductor laser diode 200. As a result, even when any of the external parts such as the bias tee is not used, the semiconductor laser drive circuit 100 can be operated at the low voltage and at the high speed.

Third Embodiment

Figure 13:
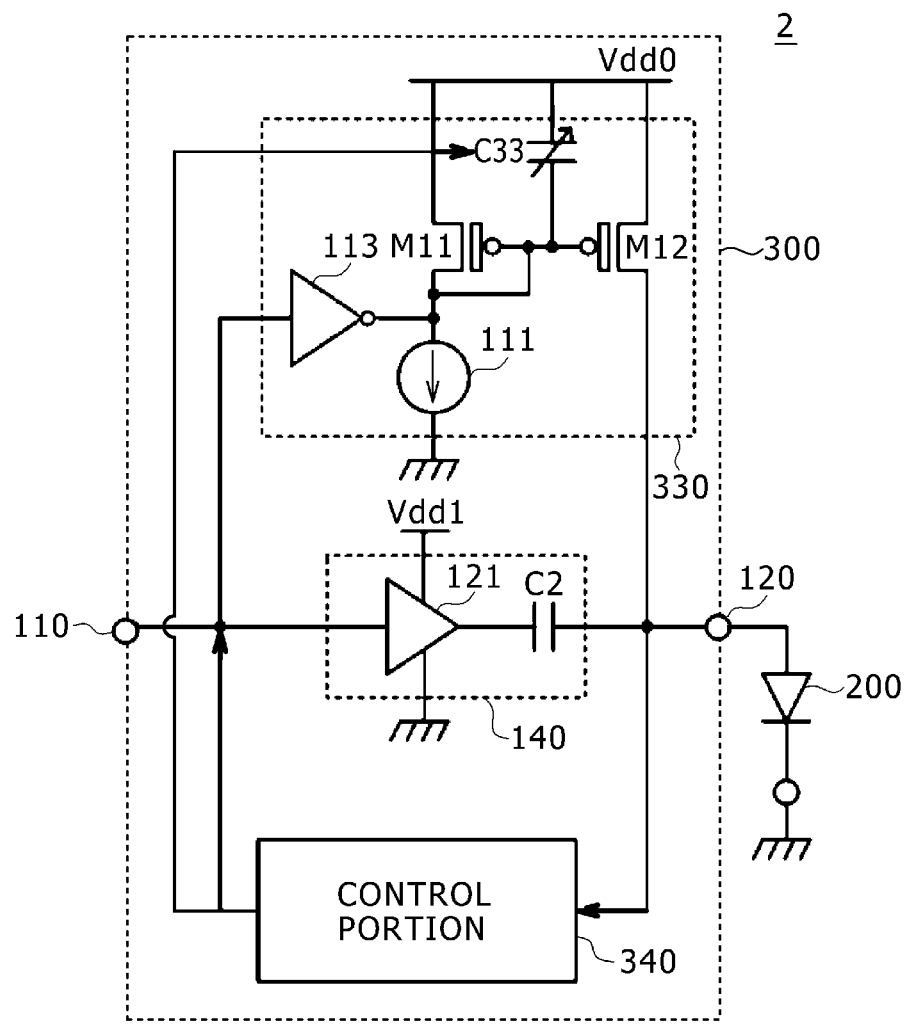
FIG. 13 is a circuit diagram, partly in block, showing a configuration of a semiconductor laser device according to a third embodiment of the present disclosure.

Next, a semiconductor laser device 2 according to a third embodiment of the present disclosure will be described with reference to FIG. 13. As shown in FIG. 13, the semiconductor laser device 2 includes a semiconductor laser driving circuit 300 and a semiconductor laser diode 200. The semiconductor laser driving circuit 300 included in the semiconductor laser device 2 of the third embodiment has the same configuration as that of the semiconductor laser drive circuit 100 of the second embodiment shown in FIG. 3 except that the semiconductor laser driving circuit 300 includes a first supply portion 330 having a variable capacitive element C33, and a control portion 340. As will be described later, the semiconductor laser driving circuit 300 is a fourth embodiment of the present disclosure. Here, the same constituent elements as those in the semiconductor laser driving circuit 100 are designated by the same reference numerals or symbols, respectively, and a repeated description thereof is omitted hereinafter for the sake of simplicity.

Even when the semiconductor laser device 2 is designed in such a way that the cut-off frequencies f1 and f2 of the first supply portion and the second supply portion of the semiconductor laser driving circuit 300 becomes equal to each other, the cut-off frequency f1 of the first supply portion, and the cut-off frequency f2 of the second supply portion are actually shifted from each other due to the use environment of the semiconductor laser driving circuit 300, and the influence of the manufacturing error in some cases. Then, in the third embodiment, a capacitance value of the capacitive element of the first supply portion can be made variable, and the cut-off frequency f1 of the first supply portion is adjusted to a value close to the cut-off frequency f2 of the second supply portion. As a result, the shifting between the cut-off frequencies of the first supply portion and the second supply portion is reduced and the distortion of the drive current which is supplied to the semiconductor laser diode is made small.

Figure 4:
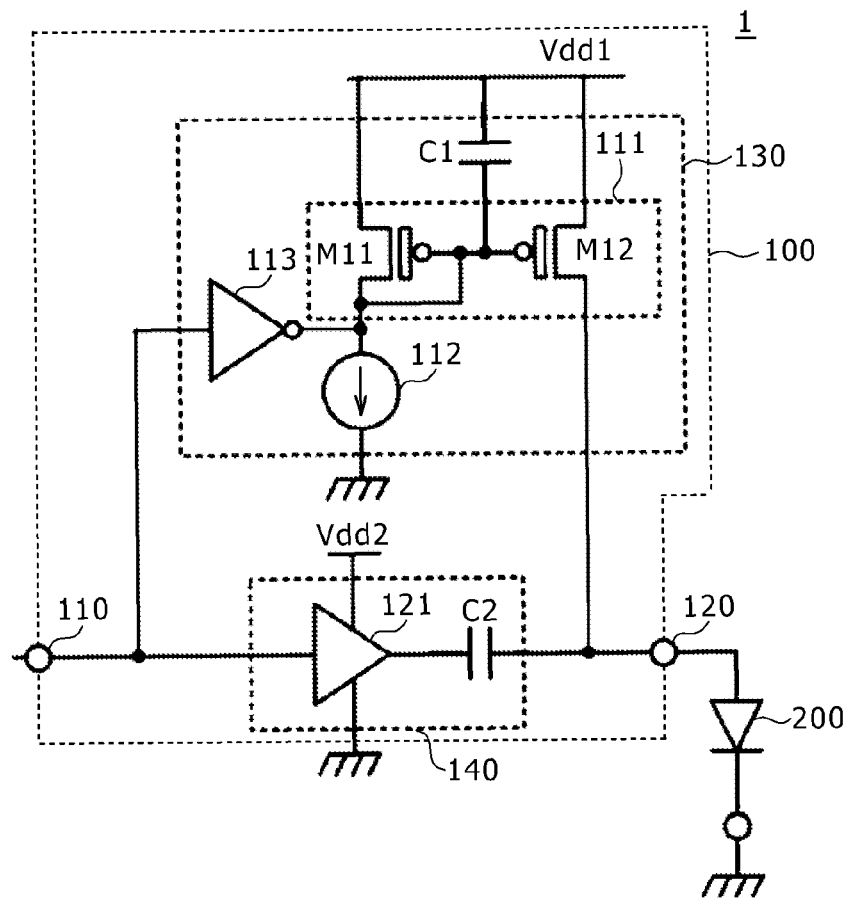
FIG. 4 is a circuit diagram showing details of the configuration of the semiconductor laser driving circuit according to the second embodiment of the present disclosure.

As shown in FIG. 13, a first supply portion 330 includes a variable capacitive element C33 instead of including the first capacitive element C1 shown in FIG. 4. One terminal of the variable capacitive element C33 is connected to the power source electric potential Vdd0, and the other terminal thereof is connected to each of the gate terminals of the transistors M11 and M12. The capacitance value of the variable capacitive element C33 is changed in accordance with a control signal from the control portion 340. It is only necessary to realize the variable capacitive element C33 with a circuit which, for example, is composed of plural capacitive elements and a switch.

The control portion 340 generates a test signal which is in turn outputted to each of the first supply portion 330 and the second supply portion 140. Also, the control portion 340 controls the capacitance value of the variable capacitive element C33 of the first supply portion 330 in accordance with the drive current I which the first supply portion 330 and the second supply portion 140 supply to the semiconductor laser diode 200.

Fourth Embodiment

Figure 14:
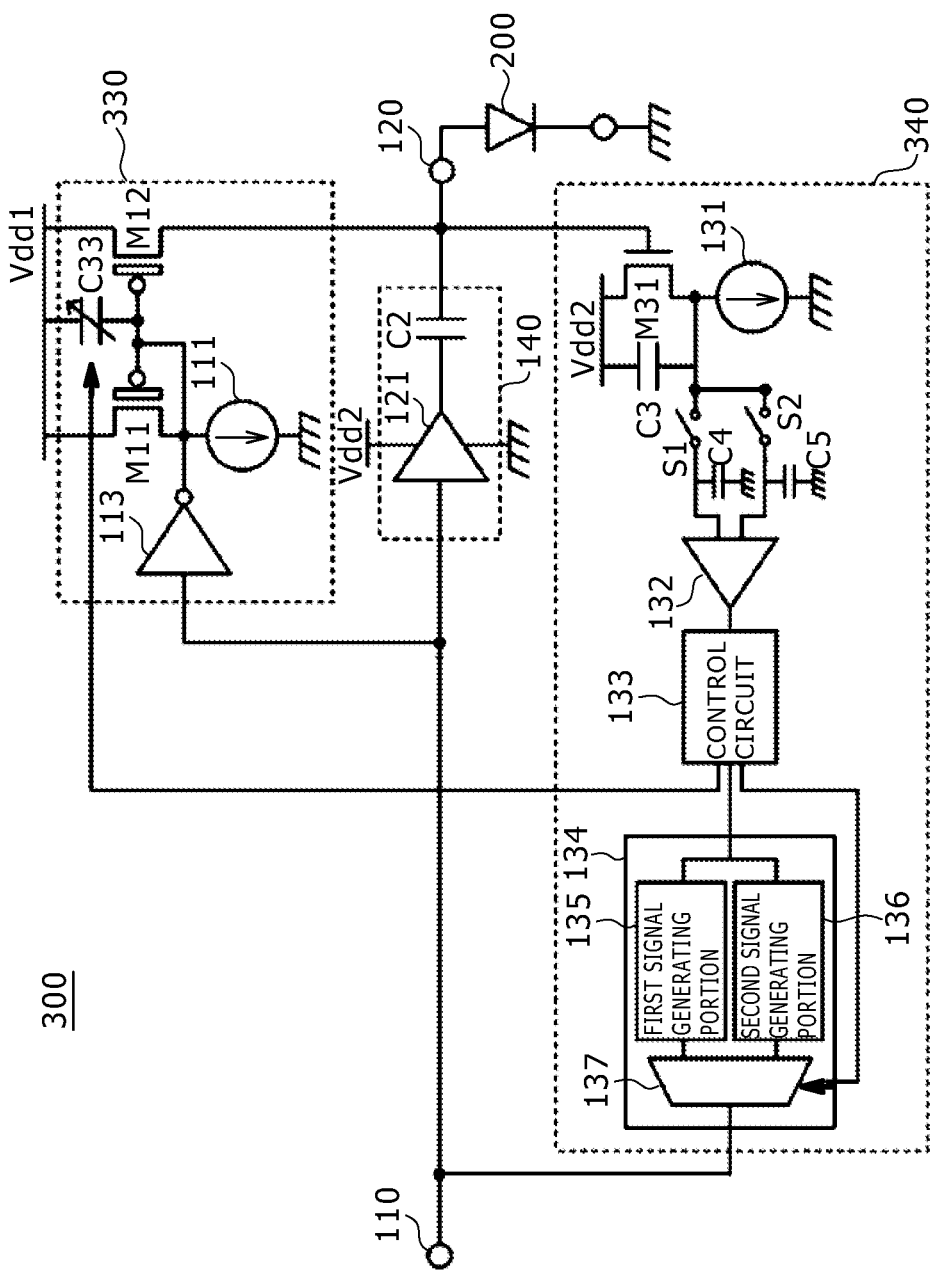
FIG. 14 is a circuit diagram showing details of a configuration of a semiconductor laser driving circuit according to a fourth embodiment of the present disclosure.

A detailed configuration of the control portion 340 in the semiconductor laser driving circuit 300 according to the fourth embodiment of the present disclosure will be described below with reference to FIG. 14. The control portion 340 includes a rectifier, a fourth capacitive element C4 and a fifth capacitive element C5, and a comparator 132. In this case, the rectifier is composed of a transistor M31, a third capacitive element C3, and a fourth current source 131. The fourth and fifth capacitive elements C4 and C5 accumulate therein signals obtained through the rectification by the rectifier. Also, the comparator 132 compares the signals accumulated in the fourth and fifth capacitive elements C4 and C5 with each other. In addition thereto, the control portion 340 includes a signal generating circuit 134 and a control circuit 133. In this case, the signal generating circuit 134 generates the test signal. Also, the control circuit 133 controls the signal generating circuit 134, and also controls the variable capacitive element C33 in accordance with a comparison result obtained from the comparator 132.

As has been described, the rectifier includes the transistor M31, the third capacitive element C3, and the fourth current source 131. In this case, a drain terminal of the transistor M31 is connected to the second power source electric potential Vdd2, and a gate terminal thereof is connected to the output terminal 120 of the semiconductor laser driving circuit 300. One terminal of the third capacitive element C3 is connected to the second power source electric potential Vdd2, and the other terminal thereof is connected to a source terminal of the transistor M31. Also, one terminal of the fourth current source 131 is connected to the source terminal of the transistor M31, and the other terminal thereof is grounded. The rectifier is configured in such a way that the transistor M31 and the third capacitive element C3 are connected in parallel with each other, and the transistor M31 and the third capacitive element C3 connected in parallel with each other and the fourth current source 131 are connected in series with each other.

One terminal of the fourth capacitive element C4 is connected to the source terminal of the transistor M31 through a first switch S1, and the other terminal thereof is grounded. The fourth capacitive element C4 accumulates therein the voltage value generated based on the drive current outputted through the output terminal 120 when a first signal which is generated by the signal generating portion 134 is inputted to each of the first supply portion 330 and the second supply portion 140.

One terminal of the fifth capacitive element C5 is connected to the source terminal of the transistor M31 through the second switch S2, and the other terminal thereof is grounded. The fifth capacitive element C5 accumulates therein the voltage value generated based on the drive current outputted through the output terminal 120 when a second signal which is generated by the signal generating portion 134 is inputted to each of the first supply portion 330 and the second supply portion 140.

The comparator 132 compares the voltage values in the fourth and fifth capacitance elements C4 and C5 with each other, and outputs the comparison result to the control circuit 133.

The signal generating portion 134 includes a first signal generating portion 135, a second signal generating portion 136, and a selector 137. In this case, the first signal generating portion 135 generates the first signal as the test signal. The second signal generating portion 136 generates the second signal as the test signal. Also, the selector 137 selects one of the first signal and the second signal, and outputs the first signal or the second signal thus selected to each of the first supply portion 330 and the second supply portion 140.

Figure 15:
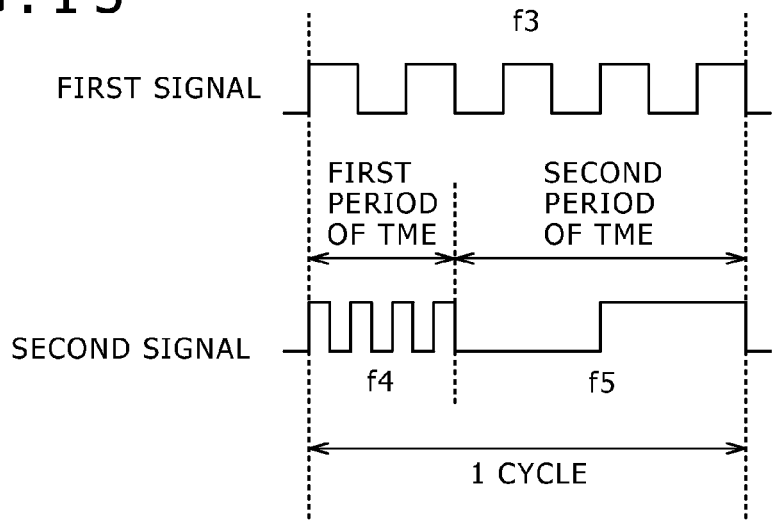
FIG. 15 is a waveform chart of a first signal and a second signal in the semiconductor laser driving circuit according to the fourth embodiment of the present disclosure.

The first signal generating portion 135 generates the first signal by receiving an instruction issued from the control circuit 133. The first signal contains therein a frequency component (third frequency component) having a third frequency f3. Specifically, as shown in FIG. 15, the first signal is a signal in which a signal set at a H level (High signal) and a signal set at a Low level (Low signal) are repeated at the third frequency f3. The first signal generating portion 135 outputs the first signal thus generated to the selector 137.

The second signal generating portion 136 generates the second signal by receiving an instruction issued from the control circuit 133. The second signal contains therein both of a frequency component (fourth frequency component) having a fourth frequency f4, and a frequency component (fifth frequency component) having a fifth frequency f5. Specifically, as shown in FIG. 15, the second signal repeats a first period of time for which the High signal and the Low signal are repeated at the fourth frequency, and a second period of time for which the High signal and the Low signal are repeated at the fifth frequency. In this case, one cycle is obtained by combining the first period of time and the second period of time with each other. The second signal generating portion 136 outputs the first signal thus generated to the selector 137.

Note that, it is supposed that the amplitudes of the first signal and the second signal have approximately the same value.

The selector 137 receives the first signal and the second signal which have been generated by the first signal generating portion 135 and the second signal generating portion 136, respectively. The selector 137 selects one of the first signal or the second signal in accordance with an instruction issued from the control circuit 133, and outputs the first signal or second signal thus selected as the input signal to each of the first supply portion 330 and the second supply portion 140.

In a phase of adjustment for adjusting the capacitive value of the variable capacitive element C33, the control circuit 133 controls the first signal generating portion 135, the second signal generating portion 136, and the selector 137 of the signal generating portion 134, and supplies either the first signal or the second signal as the input signal to each of the first supply portion 330 and the second supply portion 140. Thus, the control circuit 133 adjusts the capacitance value of the variable capacitive element C33 in accordance with the comparison result obtained from the comparator 132.

Figure 16:
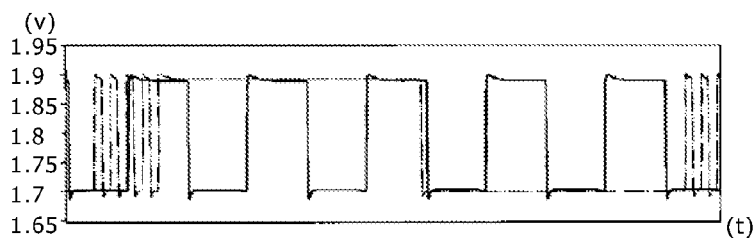
FIG. 16 is a graph explaining a simulation result made for the semiconductor laser driving circuit according to the fourth embodiment of the present disclosure.
Figure 17:
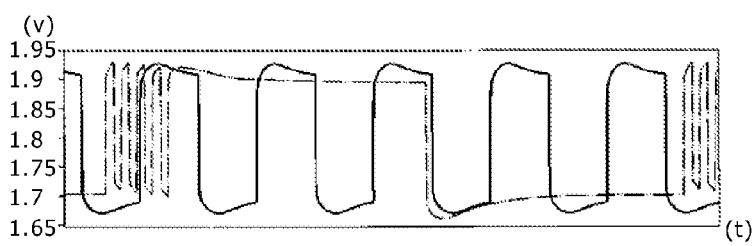
FIG. 17 is a graph explaining another simulation result made for the semiconductor laser driving circuit according to the fourth embodiment of the present disclosure.
Figure 18:
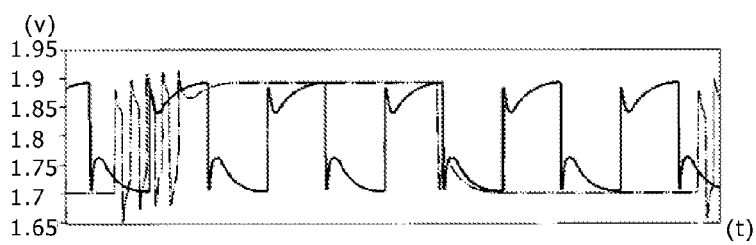
FIG. 18 is a graph explaining still another simulation result made for the semiconductor laser driving circuit according to the fourth embodiment of the present disclosure.

Next, a description will be given with respect to a method of adjusting the capacitive value of the variable capacitive element C33 by using both of the first signal and the second signal with reference to FIGS. 16 to 18. FIGS. 16 to 18 are respectively graphs showing simulation results when both of the first signal and the second signal are inputted to the first supply portion 330 and the second supply portion 140 while the cut-off frequencies of the first supply portion 330 and the second supply portion 140 are changed.

FIG. 16 is a graph showing a voltage value of the drive current outputted from the semiconductor laser driving circuit 300 when the first frequency f1 as the cut-off frequency of the first supply portion 330, and the second frequency f2 as the cut-off frequency of the second supply portion 140 are approximately equal to each other.

A solid line shown in FIG. 16 indicates the output from the rectifier when the first signal is inputted as the input signal to each of the first supply portion 330 and the second supply portion 140. As shown in FIG. 16, when the cut-off frequency f1 of the first supply 330, and the cut-off frequency f2 of the second supply portion 140 are approximately equal to each other (f1≈f2), the semiconductor laser driving circuit 300 outputs the signal having the voltage waveform which is approximately equal to that of the first signal. Hereinafter, the signal which the semiconductor laser driving circuit 300 outputs when the first signal is inputted as the input signal to each of the first supply portion 330 and the second supply portion 140 will be referred to as "a first output signal."

A two-dot chain line shown in FIG. 16 indicates the output from the semiconductor laser driving circuit 300 when the second signal is inputted as the input signal to each of the first supply portion 330 and the second supply portion 140. As shown in FIG. 16, when the cut-off frequency f1 of the first supply 330, and the cut-off frequency f2 of the second supply portion 140 are approximately equal to each other (f1≈f2), the semiconductor laser driving circuit 300 outputs the signal having the voltage waveform which is approximately equal to that of the second signal. Hereinafter, the signal which the semiconductor laser driving circuit 300 outputs when the second signal is inputted as the input signal to each of the first supply portion 330 and the second supply portion 140 will be referred to as "a second output signal."

Since the amplitudes of the first signal and the second signal are approximately equal to each other, amplitudes of the first output signal and the second output signal are approximately equal to each other. In the simulation result shown in FIG. 16, a difference in average amplitude between the first output signal and the second output signal is about 0.16 mV.

FIG. 17 is a graph showing a voltage value of the drive current outputted from the semiconductor laser driving circuit 300 when the first frequency f1 as the cut-off frequency of the first supply portion 330 is larger than the second frequency f2 as the cut-off frequency of the second supply portion 140.

A solid line shown in FIG. 17 indicates the output from the semiconductor laser driving circuit 300 when the first signal is inputted as the input signal to each of the first supply portion 330 and the second supply portion 140. A two-dot chain line shown in FIG. 17 indicates the output from the semiconductor laser driving circuit 300 when the second signal is inputted as the input signal to each of the first supply portion 330 and the second supply portion 140. When the first output signal which the semiconductor laser driving circuit 300 outputs when the first signal is inputted as the input signal to each of the first supply portion 330 and the second supply portion 140, and the second output signal which the semiconductor laser driving circuit 300 outputs when the second signal is inputted as the input signal to each of the first supply portion 330 and the second supply portion 140 are compared with each other, as shown in FIG. 17, the amplitude of the first output signal becomes larger than that of the second output signal. In the simulation result shown in FIG. 17, the difference in average amplitude between the first output signal and the second output signal is about 12.6 mV.

FIG. 18 is a graph showing a voltage value of the drive current outputted from the semiconductor laser driving circuit 300 when the first frequency f1 as the cut-off frequency of the first supply portion 330 is smaller than the second frequency f2 as the cut-off frequency of the second supply portion 140.

A solid line shown in FIG. 18 indicates the output from the semiconductor laser driving circuit 300 when the first signal is inputted as the input signal to each of the first supply portion 330 and the second supply portion 140. A two-dot chain line shown in FIG. 18 indicates the output from the semiconductor laser driving circuit 300 when the second signal is inputted as the input signal to each of the first supply portion 330 and the second supply portion 140. When the first output signal which the semiconductor laser driving circuit 300 outputs when the first signal is inputted as the input signal to each of the first supply portion 330 and the second supply portion 140, and the second output signal which the semiconductor laser driving circuit 300 outputs when the second signal is inputted as the input signal to each of the first supply portion 330 and the second supply portion 140 are compared with each other, as shown in FIG. 18, the amplitude of the first output signal becomes smaller than that of the second output signal. In the simulation result shown in FIG. 18, the difference in the average amplitude between the first output signal and the second output signal is about −10.74 mV.

The control circuit 133, for example, carries out an adjustment mode when the chip loaded with the semiconductor laser driving circuit 300 is shipped out, when a power source for the semiconductor laser driving circuit 300 is turned ON, or every given period of time while the semiconductor laser driving circuit 300 is driven.

Specifically, when the control circuit 133 carries out the adjustment mode, firstly, the first signal generating portion 135 of the signal generating portion 134 is instructed by the control circuit 133 to generate the first signal. The control circuit 133 controls the selector 137 in such a way that the first signal is supplied as the input signal to each of the first supply portion 330 and the second supply portion 140.

A lapse of a given period of time after, the first signal had been supplied as the input signal to each of the first supply portion 330 and the second supply portion 140, the control circuit 133 controls both of the second signal generating portion 136 and the selector 137 in such a way that the second signal is supplied as the input signal to each of the first supply portion 330 and the second supply portion 140.

The control circuit 133 receives the result of the comparison between the voltage obtained by rectifying the voltage generated based on the drive current I when the first signal is inputted as the input signal to each of the first and second supply portions 330 and 140, that is, the average amplitude of the first output signal, and the voltage obtained by rectifying the voltage generated based on the drive current I when the second signal is inputted as the input signal to each of the first and second supply portions 330 and 140, that is, the average amplitude of the second output signal from the comparator.

When it is judged based on the comparison result from the comparator 132 that the amplitude of the first output signal is larger than that of the second output signal, the control circuit 133 controls the variable capacitive element C33 in such a way that the cut-off frequency f1 of the first supply portion 330 is reduced.

On the other hand, when it is judged based on the comparison result from the comparator 132 that the amplitude of the first output signal is smaller than that of the second output signal, the control circuit 133 controls the variable capacitive element C33 in such a way that the cut-off frequency f1 of the first supply portion 330 is increased.

In addition, it is judged based on the comparison result from the comparator 132 that the amplitude of the first output signal is equal to that of the second output signal, the control circuit 133 ends the adjustment mode. When the adjustment mode has been ended, the semiconductor laser driving circuit 300 supplies the input signal inputted thereto from the outside to the semiconductor laser diode 200.

As described above, in the semiconductor laser driving circuit 300 according to the fourth embodiment of the present disclosure, the variable capacitive element C33 is provided in the first supply portion 330, and the cut-off frequency f1 of the first supply portion 330 is adjusted. As a result, the drive current which has the less distortion can be supplied to the semiconductor laser diode 200 irrespective of the manufacture error of the semiconductor laser driving circuit 300, and the change in the environment.

It is noted that although in the fourth embodiment, the control circuit 133 adjusts the cut-off frequency f1 of the first supply portion 330, alternatively, the control circuit 133 may adjust the cut-off frequency f2 of the second supply portion 140. In this case, a method is expected in which the second capacitive element C2 of the second supply portion 140 is made the variable capacitive element. However, when the second capacitive element C2 of the second supply portion 140 is made the variable capacitive element, it may be impossible to carry out the switching operation of the second supply portion 140 at the high speed in some cases. Therefore, in the case where the second supply portion 140 is operated at the high speed, and so forth, it is preferable to adjust the cut-off frequency f1 of the first supply portion 330.

Finally, the embodiments described above are merely an exemplification of the present disclosure, and thus the present disclosure is by no means limited to the embodiments described above. For this reason, it is to be understood that even in any of aspects other than the embodiments described above, various kinds of changes can be made in accordance with the design and the like without departing from the technical idea of the embodiments described above.

The present disclosure contains subject matter related to that disclosed in Japanese Priority Patent Application JP 2011-224857 filed in the Japan Patent Office on Oct. 12, 2011, the entire content of which is hereby incorporated by reference.

What is claimed is:

1. A semiconductor laser driving circuit, comprising:
    a first supply portion operable to supply a first supply signal obtained from an input signal, wherein the first supply signal has a frequency equal to or lower than a first frequency of the input signal; and
    a second supply portion operable to supply a second supply signal obtained from the input signal, wherein the second supply signal has a frequency higher than the first frequency of the input signal, wherein the first supply portion comprises a variable capacitive element connected to a gate terminal of a high-withstand voltage transistor, wherein the first frequency is adjusted by adjusting a capacitance value of the variable capacitive element.

2. The semiconductor laser driving circuit according to claim 1, wherein said first supply portion comprises:
    a current source which generates a bias current; and
    a current mirror circuit comprising the high-withstand voltage transistor, wherein the first supply portion superimposes the bias current and the first supply signal to supply a resulting signal to an output terminal.

3. The semiconductor laser driving circuit according to claim 1, further comprising:
    an input terminal operable to receive the input signal; and
    an output terminal operable to output a drive current based on the input signal for controlling a laser diode.

4. A semiconductor laser driving circuit supplying a drive current to a semiconductor laser diode connected to an output terminal based on an input signal inputted thereto through an input terminal, thereby controlling said semiconductor laser diode, said semiconductor laser driving circuit, comprising:
    a first supply portion supplying a bias current, and a first supply signal having a frequency component whose frequency is equal to or lower than a first frequency of the input signal; and
    a second supply portion supplying a second supply signal having a frequency component whose frequency is higher than a second frequency of the input signal, wherein said first supply portion includes:
        a current source generating the bias current;
        a current mirror circuit having a high-withstand voltage transistor, and superimposing bias current and the first supply signal on each other to supply the resulting signal to said output terminal; and a first capacitive element connected to a gate terminal of said high-withstand voltage transistor, wherein said first capacitive element is a variable capacitive element, and the first frequency is adjusted by adjusting a capacitance value of said first capacitive element.

5. The semiconductor laser driving circuit according to claim 4, further comprising:

a control portion adjusting the capacitance value of said first capacitive element in accordance with a comparison result obtained by comparing a voltage value obtained by rectifying a voltage generated based on the drive current when a first signal having a third frequency component is made the input signal, wherein a voltage value obtained by rectifying a voltage generated based on the drive current when a second signal having a fourth frequency component and a fifth frequency component is made the input signal.

6. The semiconductor laser driving circuit according to claim 4, wherein the first frequency and the second frequency are approximately equal to each other.

7. A semiconductor laser device, comprising:

a semiconductor laser diode; and a semiconductor laser driving circuit operable to supply a drive current to the semiconductor laser diode based on an input signal, wherein the semiconductor laser driving circuit comprises:

a first supply portion operable to supply a first supply signal obtained from the input signal, wherein the first supply signal has a frequency equal to or lower than a first frequency of the input signal; and a second supply portion operable to supply a second supply signal obtained from the input signal, wherein the second supply signal has a frequency higher than the first frequency of the input signal, wherein the first supply portion comprises a variable capacitive element connected to a gate terminal of a high-withstand voltage transistor, wherein the first frequency is adjusted by adjusting a capacitance value of the variable capacitive element.

* * * * *